United States Patent
Vanukuru et al.

(10) Patent No.: US 11,651,884 B2
(45) Date of Patent: May 16, 2023

(54) PEAKING INDUCTOR EMBEDDED WITHIN A T-COIL

(71) Applicant: GLOBALFOUNDRIES U.S. Inc., Santa Clara, CA (US)

(72) Inventors: Venkata N. R. Vanukuru, Karnataka (IN); Umesh Kumar Shukla, Karnataka (IN); Sandeep Torgal, Karnataka (IN)

(73) Assignee: GlobalFoundries U.S. Inc., Santa Clara, CA (US)

( * ) Notice: Subject to any disclaimer, the term of this patent is extended or adjusted under 35 U.S.C. 154(b) by 1086 days.

(21) Appl. No.: 16/365,121

(22) Filed: Mar. 26, 2019

(65) Prior Publication Data
US 2020/0312514 A1 Oct. 1, 2020

(51) Int. Cl.
*H01L 23/52* (2006.01)
*H01F 17/00* (2006.01)
*H01L 23/60* (2006.01)
*H01L 23/522* (2006.01)

(52) U.S. Cl.
CPC ..... *H01F 17/0013* (2013.01); *H01L 23/5227* (2013.01); *H01L 23/60* (2013.01)

(58) Field of Classification Search
CPC .......... H01F 17/0013; H01F 2017/002; H01L 23/5227; H01L 23/60
See application file for complete search history.

(56) References Cited

U.S. PATENT DOCUMENTS

| | | | |
|---|---|---|---|
| 5,610,433 A | 3/1997 | Merrill et al. | |
| 7,463,112 B1 | 12/2008 | Groves | |
| 8,453,092 B2 | 5/2013 | Kireev et al. | |
| 9,048,017 B2* | 6/2015 | Kireev | H01F 17/0013 |
| 9,502,168 B1 | 11/2016 | Ler et al. | |
| 2011/0248811 A1* | 10/2011 | Kireev | H01L 23/5227 |
| | | | 336/200 |
| 2012/0314328 A1* | 12/2012 | Dill | H01F 27/2804 |
| | | | 361/56 |

(Continued)

FOREIGN PATENT DOCUMENTS

CN 105103321 A 11/2015

OTHER PUBLICATIONS

Taiwan Intellectual Property Office, Examination Report received in Taiwanese Patent Application No. 109106250 dated Dec. 1, 2020.

*Primary Examiner* — S M Sohel Imtiaz
(74) *Attorney, Agent, or Firm* — Thompson Hine LLP; Anthony Canale (57) ABSTRACT

Structures that include a peaking inductor and a T-coil, and methods associated with forming such structures. A back-end-of-line interconnect structure includes a first metallization level, a second metallization level, and a third metallization level arranged between the first metallization level and the second metallization level. The T-coil includes a first inductor with a first coil arranged in the first metallization level and a second inductor with a second coil arranged in the second metallization level. A peaking inductor includes a coil arranged in the third metallization level. The first coil of the first inductor, the second coil of the second inductor, and the coil of the peaking inductor are stacked in the back-end-of-line interconnect structure with an overlapping arrangement.

20 Claims, 4 Drawing Sheets

(56) References Cited

U.S. PATENT DOCUMENTS

| | | | | |
|---|---|---|---|---|
| 2014/0266434 | A1* | 9/2014 | Kireev | H01L 28/10 |
| | | | | 336/200 |
| 2017/0213637 | A1* | 7/2017 | Vanukuru | H01F 17/0013 |
| 2018/0366535 | A1* | 12/2018 | Chong | H01L 28/10 |
| 2019/0074686 | A1* | 3/2019 | Fan | H01L 27/0288 |
| 2019/0074687 | A1* | 3/2019 | Fan | H01F 27/2804 |

* cited by examiner

PEAKING INDUCTOR EMBEDDED WITHIN A T-COIL

BACKGROUND

The present invention relates to semiconductor device fabrication and integrated circuits and, more specifically, to structures that include a peaking inductor and a T-coil, and methods associated with forming such structures.

Inductors represent a type of on-chip passive device commonly employed in many types of monolithic integrated circuits designed to operate at high frequencies. Inductors may be fabricated in the metallization levels of a back-end-of-line (BEOL) interconnect structure on the chip. An inductor may be characterized by a quality factor, which is a figure-of-merit representing a measure of the relationship between energy loss and energy storage. A high value for the quality factor reflects low energy losses to the substrate of the chip. However, increasing the quality factor is achieved at the expense of increasing the size of the inductor. The design of an on-chip inductor often must balance, as a tradeoff, the space occupied by the inductor on the chip with the value of the quality factor of the inductor.

Chips may integrate an on-chip inductor with a T-coil in a circuit design to provide inductive peaking. These circuit designs tend to make rather inefficient use of the available space in the BEOL interconnect structure. In particular, completely separate and laterally-spread areas are commonly used in the chip layout for the placement of the on-chip peaking inductor and the placement of the T-coil. The T-coil and on-chip peaking inductor also have individual keep out zones that further exacerbate the inefficient use of the available space on the chip.

Improved structures that include a peaking inductor and a T-coil, and methods associated with forming such structures, are needed.

SUMMARY

In an embodiment of the invention, a structure includes a back-end-of-line interconnect structure having a first metallization level, a second metallization level, and a third metallization level arranged between the first metallization level and the second metallization level. The structure further includes a T-coil having a first inductor with a first coil arranged in the first metallization level and a second inductor with a second coil arranged in the second metallization level. A peaking inductor includes a coil arranged in the third metallization level. The first coil of the first inductor, the second coil of the second inductor, and the coil of the peaking inductor are stacked in the back-end-of-line interconnect structure with an overlapping arrangement.

In an embodiment of the invention, a method includes forming a first inductor of a T-coil having a first coil arranged in a first metallization level of a back-end-of-line interconnect structure, forming a second inductor of the T-coil having a second coil arranged in a second metallization level of the back-end-of-line interconnect structure, and forming a peaking inductor having a coil arranged in a third metallization level of the back-end-of-line interconnect structure. The third metallization level is arranged between the first metallization level and the second metallization level. The first coil of the first inductor, the second coil of the second inductor, and the coil of the peaking inductor are stacked in the back-end-of-line interconnect structure with an overlapping arrangement.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention. In the drawings, like reference numerals refer to like features in the various views.

DETAILED DESCRIPTION

Figure 1:
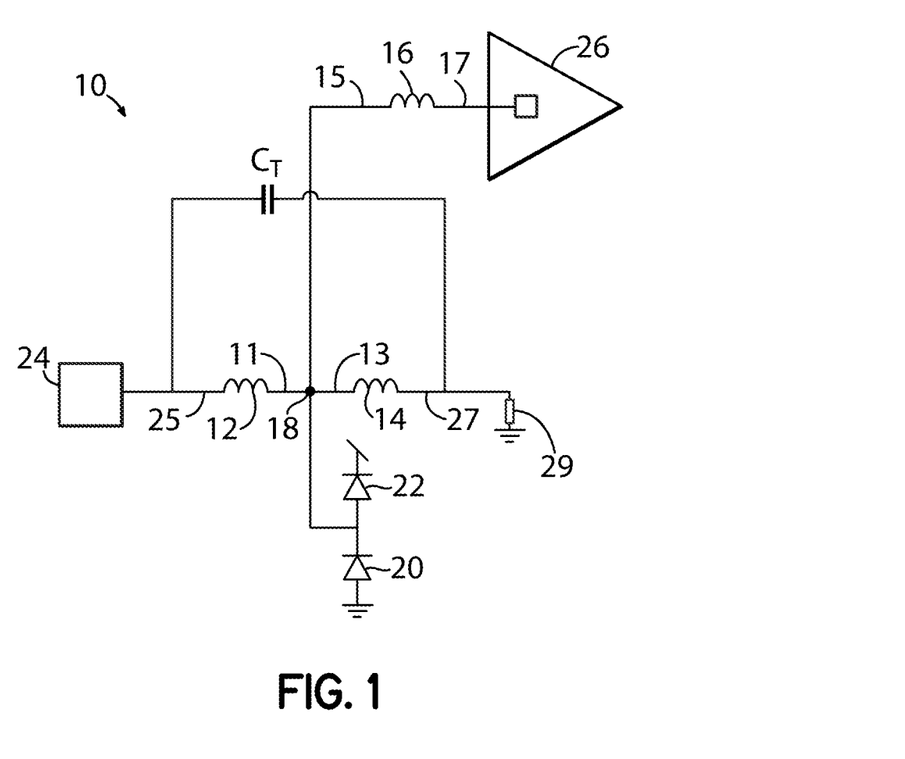
FIG. 1 is a circuit diagram of a circuit that includes an inductor and a T-coil in accordance with embodiments of the invention.
Figure 2:
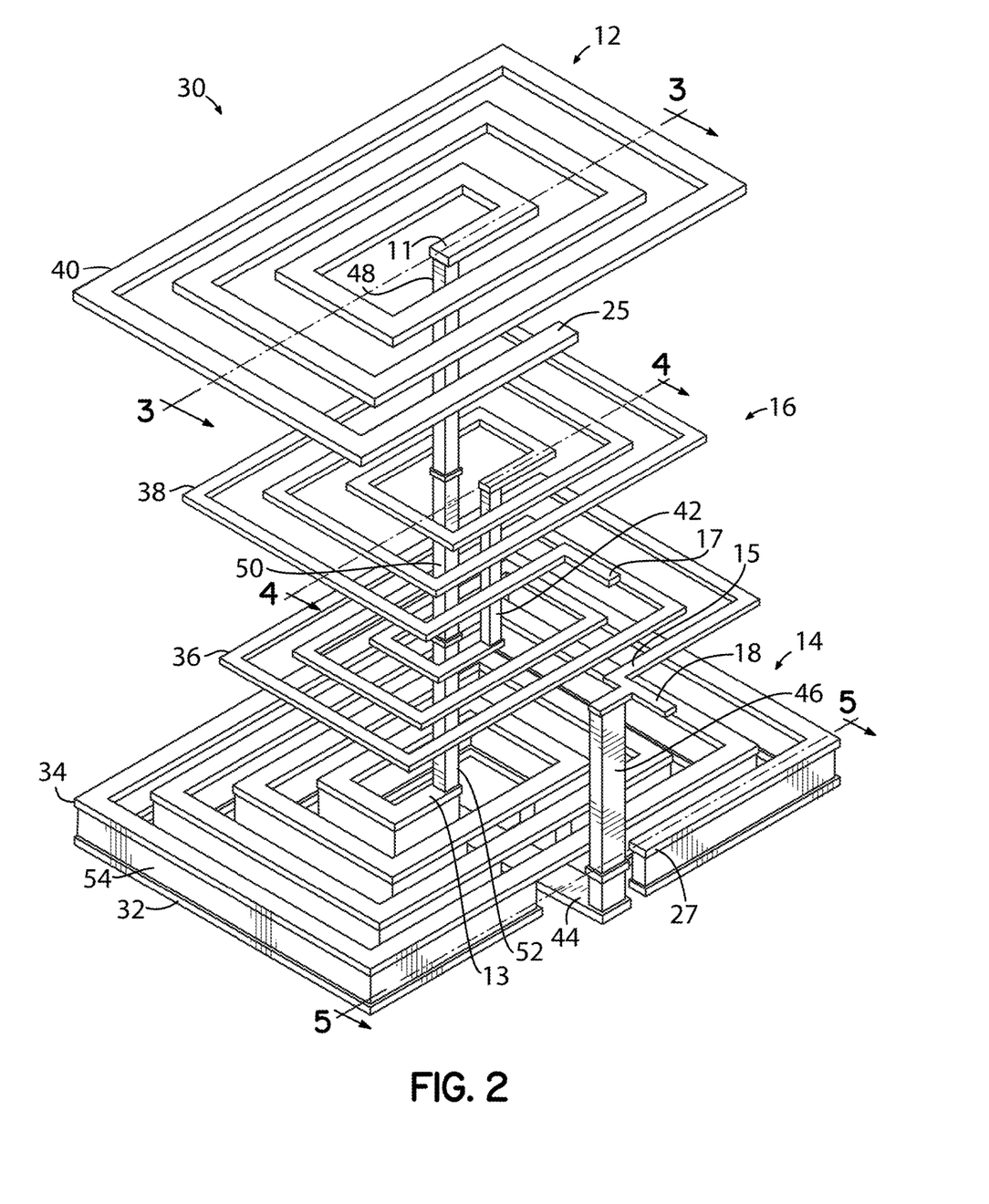
FIG. 2 is a perspective view of the inductor and T-coil of FIG. 1 in which interlayer dielectric layers are omitted for simplicity of illustration.
Figure 3:
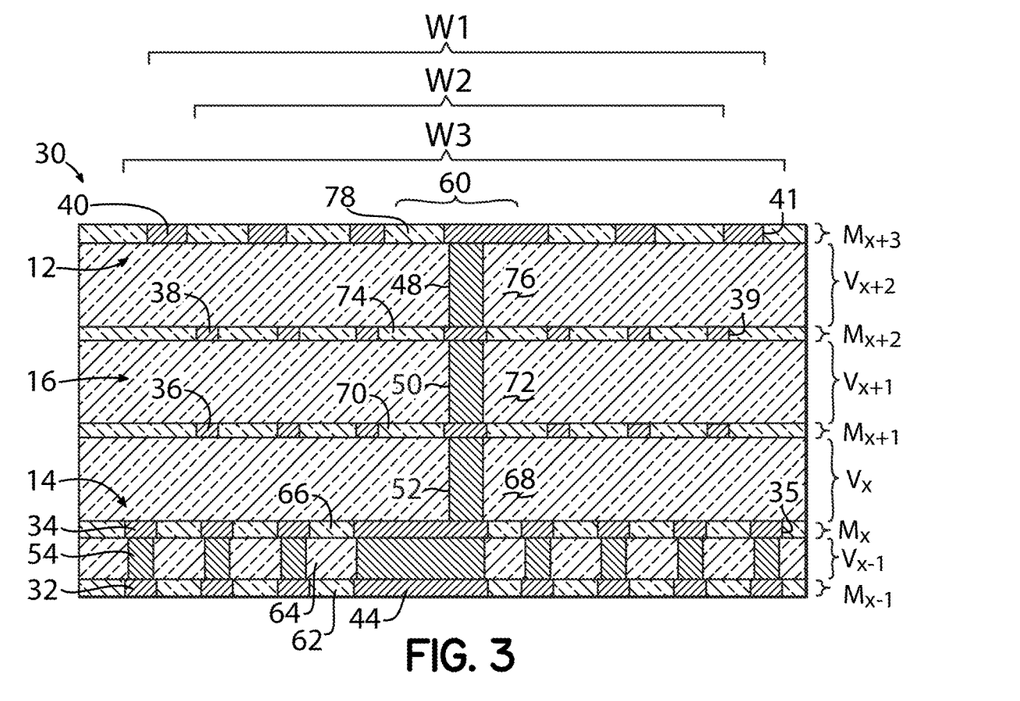
FIG. 3 is a cross-sectional view taken generally along line 3-3 in FIG. 2.
Figure 4:
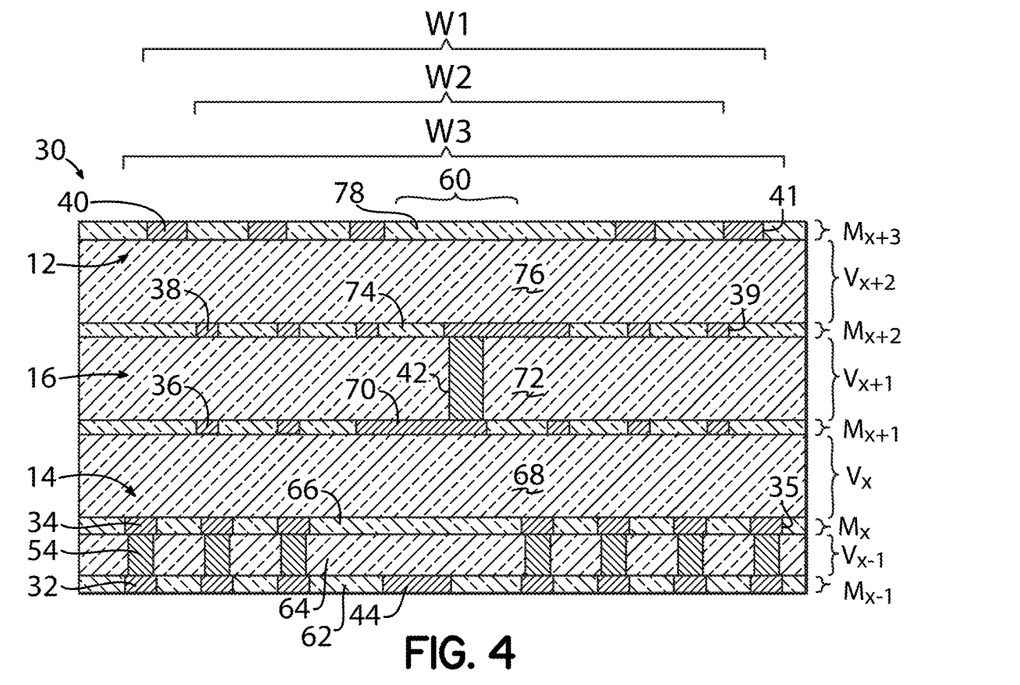
FIG. 4 is a cross-sectional view taken generally along line 4-4 in FIG. 2.
Figure 5:
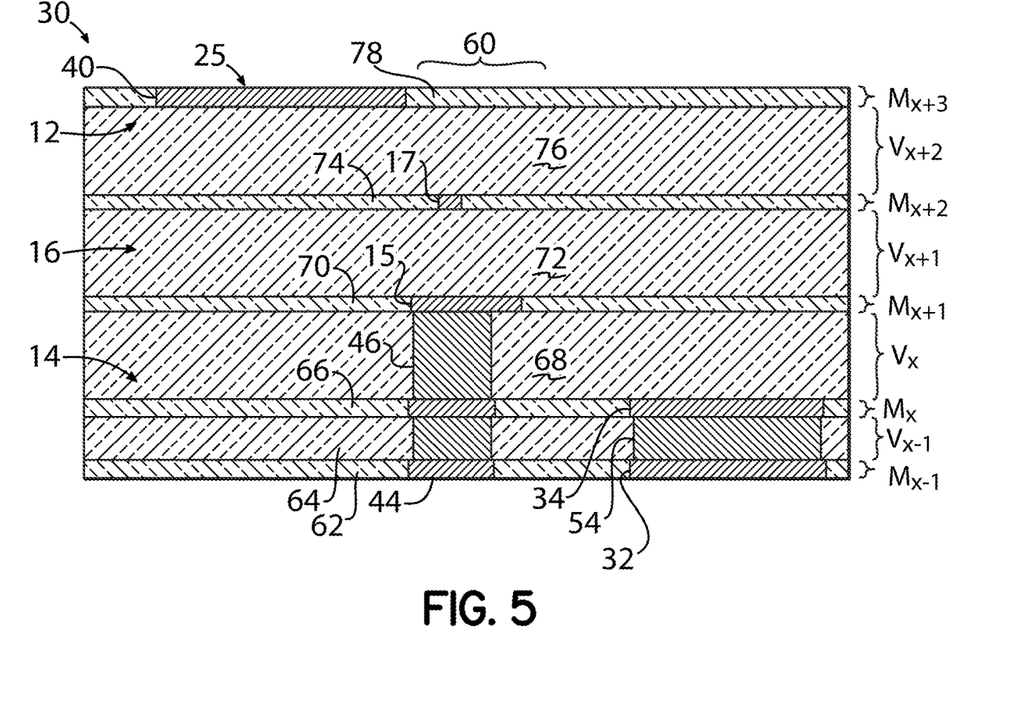
FIG. 5 is a cross-sectional view taken generally along line 5-5 in FIG. 2.

With reference to FIG. 1 and in accordance with embodiments of the invention, a circuit 10 includes multiple inductors 12, 14, 16 that are disposed on a chip that also includes one or more integrated circuits fabricated by front-end-of-line (FEOL) processing. The inductors 12, 14, 16 are located within an interconnect structure 30 (FIGS. 2-4) of the chip that may be formed by back-end-of-line (BEOL) processing. The inductors 12, 14 are included in the circuit 10 as connected components of a T-coil. The turns or windings of the inductors 12, 14 included in the T-coil are stacked in a vertical direction with the turns or windings of the inductor 16, as subsequently described, to provide a composite structure having a stacked arrangement of windings. The stacked arrangement of the windings of the inductors 12, 14, 16 provides a more compact structure in comparison with non-stacked arrangements.

A terminal 11 of the inductor 12, a terminal 13 of the inductor 14, and a terminal 15 of the inductor 16 are coupled at a common node 18. The circuit 10 may further include electrostatic discharge devices 20, 22, an input/output pad 24, a design element 26, and a transmission-line termination resistor 29. The design element 26 may be a drive or a gain stage, such as an amplifier. The inductor 16 may have a terminal 17 that is coupled with the design element 26. The input/output pad 24 is coupled to a terminal 25 of the inductor 12, the electrostatic discharge devices 20, 22 are coupled to the common node 18, and the transmission-line termination resistor 29 (e.g., a 50-ohm metal resistor) is coupled to a terminal 27 of the inductor 14. A signal may be routed from the input/output pad 24 in a signal path through the circuit 10 to the design element 26. The electrostatic discharge devices 20, 22 may function to protect the sensitive device structures of the design element 26 against receiving a high current from an electrostatic discharge event occurring at the input/output pad 24. The electrostatic discharge devices 20, 22 may be, for example, diodes of a diode string. The inductors 12, 14 of the T-coil may be characterized by a parasitic capacitance, though not an actual physical circuit element, that is diagrammatically represented in FIG. 1 by the symbol $C_T$.

The inductor 16 may be used for bandwidth extension in, for example, a high-speed transceiver design and is also referred to herein as a peaking inductor. The inductors 12, 14 of the T-coil may be used in a high-speed transceiver design to compensate for the capacitance of the electrostatic discharge devices 20, 22 in order to, for example, maintain return loss and reduce insertion loss.

With reference to FIGS. 2-5 and in accordance with embodiments of the invention, the inductors 12, 14 of the T-coil and the inductor 16 may be stacked in the composite structure with a vertically-spaced arrangement within multiple metallization levels of the back-end-of-line (BEOL) interconnect structure, generally indicated by reference numeral 30. The inductors 12, 14, 16 of the composite structure collectively include multiple coils are stacked within interlayer dielectric layers 62, 66, 70, 74, 78 belonging to multiple metallization levels. Each of the inductors 12, 14, 16 may individually include one or more coils that are respectively stacked within one or more of the metallization levels and that may be connected in parallel and/or in series. In an embodiment, the inductors 12, 14, 16 of the composite structure may include five coils that are arranged in five different metallization levels. In an embodiment, the coils of the inductors 12, 14, 16 are arranged in different metallization levels with only a single coil in each metallization level. The coil of the inductor 12, the coil of the inductor 14, and the coil of the inductor 16 are stacked in the different metallization levels of the BEOL interconnect structure 30 with an overlapping arrangement. The overlap is provided by the relative lateral positioning of the inductors 12, 14, 16 in the different metallization levels of the BEOL interconnect structure 30 and the relative size of the inductors 12, 14, 16.

In the representative embodiment, the inductor 16 includes multiple turns or windings 36 that are arranged in a coil placed within the interlayer dielectric layer 70 of a metallization level ($M_{x+1}$) of the BEOL interconnect structure 30, and the inductor 16 further includes turns or windings 38 that are arranged in a coil within the interlayer dielectric layer 74 of a metallization level ($M_{x+2}$) of the BEOL interconnect structure 30. The inductor 12 of the T-coil includes multiple turns or windings 40 that are arranged in a coil placed within the interlayer dielectric layer 78 of a metallization level ($M_{x+3}$) of the BEOL interconnect structure 30. The inductor 14 of the T-coil includes multiple turns or windings 32 that are arranged in a coil placed within the interlayer dielectric layer 61 of metallization level ($M_{x-1}$) of the BEOL interconnect structure 30 and multiple turns or windings 34 that are arranged in a coil placed within the interlayer dielectric layer 66 of metallization level ($M_x$) of the BEOL interconnect structure 30. Additional metallization levels (not shown) may exist below the lowest metallization level ($M_{x-1}$), and additional metallization levels (not shown) may exist above the highest metallization level ($M_{x+3}$). Additional conductive features (not shown) in the different metallization levels interconnect devices of an integrated circuit, and the additional conductive features may provide circuit-to-circuit connections or may establish contacts with input and output terminals.

Each set of windings 32, 34, 36, 38, 40 may be considered to wind or spiral inwardly from a terminating terminal of an outermost winding to a terminating terminal of an innermost winding, which is arranged in a central region 60 of the composite structure that is filled by dielectric material from the interlayer dielectric layers 62-78 of the BEOL interconnect structure 30. In the representative embodiment, the coil provided by each set of windings 32, 34, 36, 38, 40 may have a rectangular layout with straight segments arranged about a common centerline and with corners defined at respective segment intersections providing changes in direction. The height and width dimensions of the individual windings in each set of windings 32, 34, 36, 38, 40 may differ such that their respective cross-sectional areas may differ. For example, the cross-sectional area of the windings 40 may be greater than either the cross-sectional area of the windings 32 or the cross-sectional area of the windings 34.

The inductor 12 has a perimeter 41 established by an outermost winding 40, and an innermost winding 40 that is placed and arranged to promote the establishment of a vertical interconnection to the inductor 14. The inductor 16 has a perimeter 39 established by the outermost winding 36 and/or an outermost winding 38, and innermost windings 36, 38 that are placed and arranged to permit the passage of the vertical interconnection between the inductors 12, 14 of the T-coil without intersection or connection between the vertical interconnection and these innermost windings 36, 38. The inductor 14 has a perimeter 35 established by one or both of the outermost windings 32, 34.

The perimeter 41 of the inductor 12 may surround an area generally defined by a width dimension, W1, and a length dimension transverse to the width dimension. The perimeter 35 of the inductor 14 may surround an area generally defined by of a width dimension, W3, and a length dimension transverse to the width dimension. In an embodiment, the dimensions of the inductor 12 may be substantially equal to the dimensions of the inductor 14 to provide substantially equal areas. The perimeter 39 of the inductor 16 may surround an area generally defined by a width dimension, W2, and a length dimension transverse to the width dimension. The area of the inductor 12 and the area of area of the inductor 14 may each be greater than the area of the inductor 16. The area of the inductor 12 may be equal to the area of area of the inductor 14.

The footprints represented by the respective areas of each inductor 12, 14, 16 may be projected in a vertical direction relative to the substrate 28. In an embodiment, the lateral dimensions of the inductor 16 at its perimeter 39 may be less than the lateral dimensions of the inductors 12, 14 at their respective perimeters 35, 41, and the lateral arrangement may locate the area occupied by the inductor 16 laterally within or inside the respective areas occupied by the inductors 12, 14 to provide an overlapping arrangement from a vertical perspective. In an alternative embodiment, the lateral dimensions of the inductor 16 at its perimeter 39 may be substantially equal to the lateral dimensions of the inductors 12, 14 at their respective perimeters 35, 41, and the lateral arrangement may locate the area occupied by the inductor 16 to be laterally coincident with the respective areas occupied by the inductors 12, 14 to provide a fully overlapping arrangement. The overlapping arrangement of the inductor 16 with the inductors 12, 14 efficiently uses the available space in the BEOL interconnect structure 30.

In an embodiment, the perimeter 39 of the inductor 16 is fully arranged inside of, or circumscribed by, the perimeter 41 of the inductor 12 such that the surrounded area of inductor 16 is less than the surrounded area of inductor 12. In an embodiment, the perimeter 39 of the inductor 16 is fully arranged inside of, or circumscribed by, the perimeter 35 of the inductor 14 such that the surrounded area of inductor 16 is less than the surrounded area of inductor 14. In an embodiment, the perimeter 39 of the inductor 16 is fully arranged inside of, or circumscribed by, the perimeter 41 of the inductor 12 and fully arranged inside the perimeter 35 of the inductor 14 such that the surrounded area of inductor 16 is less than the surrounded area of inductor 12 and is less than the surrounded area of inductor 14. As used herein, different coils may have a circumscribed and overlapping arrangement although disposed in different metallization levels of the BEOL interconnect structure 30.

The windings 36 of the inductor 16 and the windings 38 of the inductor 16 are connected in series by a vertical connection that is provided by a via 42 arranged in a via level ($V_{x+1}$) that is vertically between the metallization level ($M_{x+1}$) and the metallization level ($M_{x+2}$) of the BEOL interconnect structure 30. The via 42 is located in a via opening that extends in a vertical direction through the interlayer dielectric layer 72 of the via level ($V_{x+1}$). The windings 38 spiral inwardly from a terminal of the inductor 16 at the terminal 17 (FIG. 1) coupled with the substrate 28 to the via 42 and the windings 36 spiral outwardly from the via 42 to another terminal of the inductor 16. The latter terminal of the inductor 16 is connected with a center tap 44 by a vertical connection that is provided by a via 46 arranged in a via level ($V_x$) vertically between the metallization level ($M_{x+1}$) and the metallization level ($M_x$) of the BEOL interconnect structure 30. The via 46 is located in a via opening that extends in the vertical direction through the interlayer dielectric layer 68 of the via level ($V_x$). The center tap 44, which may be disposed in the metallization level ($M_{x-1}$), physically represents the common node 18 of the circuit 10 (FIG. 1) and is connected with the windings 32 of inductor 14.

The inductor 12 of the T-coil terminates at the terminal 25 (FIG. 1) that is coupled with the input/output pad 24. The windings 40 of the inductor 12 spiral inwardly from this terminal to another terminal of the inductor 12 arranged near the center of inductor 12. The latter terminal of the inductor 12 in metallization level ($M_{x+3}$) is connected with the windings 34 in metallization level ($M_x$) by a vertical interconnection. In the representative embodiment, the vertical interconnection is provided by a stacked series of vias 48, 50, 52 extending through he windings 38 providing the coil of inductor 16 and the windings 36 providing the coil of inductor 16 in the central region 60 of the composite structure. The via 48 is arranged in a via level ($V_{x+2}$) vertically between the metallization level ($M_{x+2}$) and the metallization level ($M_{x+3}$) of the BEOL interconnect structure 30, the via 50 is arranged in via level ($V_{x+1}$), and the via 52 is arranged in via level ($V_x$). An island in the metallization level ($M_{x+2}$) that includes the windings 36 of the inductor 16 is arranged between the vias 48, 50 and another island in the metallization level ($M_{x+1}$) that includes the windings 34 of the inductor 16 is arranged between the vias 46, 48. The via 48 is located in a via opening that extends in the vertical direction through the interlayer dielectric layer 76 of via level ($V_{x+2}$), the via 50 is located in a via opening that extends in the vertical direction through the interlayer dielectric layer 72 of via level ($V_{x+1}$), and via 52 is located in a via opening that extends in the vertical direction through the interlayer dielectric layer 68 of via level ($V_x$).

The vias 48, 50, 52 and, in particular, the via 50, are arranged with an offset relative to the via 42 to promote the formation of vertical interconnections among the inductors 12, 14, 16. The vertical interconnection provided by the vias 48, 50, 52 extends through the dielectric material in the central region 60 of the composite structure from an upper coil (e.g., the windings 40 of the inductor 16) through the metallization levels ($M_{x+2}$), ($M_{x+1}$) to a lower metallization level ($M_x$) without connecting to the windings 36, 38 of either the intervening coils of the inductor 16.

The center tap 44 is coupled with a terminal of the windings 32 of the inductor 14 in the metallization level ($M_{x-1}$). The windings 32 of the inductor 14 in the metallization level ($M_x$) and the windings 34 of the inductor 14 are connected in parallel by vertical connections that are provided by vias 54 arranged in the interlayer dielectric layer 64 of a via level ($V_{x-1}$) vertically between the metallization level ($M_x$) and the metallization level ($M_{x-1}$) of the BEOL interconnect structure 30. In an embodiment, the vias 54 may be bar vias. The coupled windings 32 and 34 of the inductor 14 spiral outwardly from the terminal coupled with the center tap 44 to another terminal 27 (FIG. 1) that is coupled with the design element 26. In an alternative embodiment, the windings 32 of the inductor 14 in the metallization level ($M_{x-1}$) may be omitted such that the inductor 14 only includes windings 34, and the center tap 44 is placed in the metallization level ($M_x$) and connected with the windings 34.

The inductors 12, 14 of the T-coil and inductor 16 may have various arrangements, such as an arrangement as in the representative embodiment in which the inductor 16 sandwiched between the inductors 12, 14 of the T-coil, the inductor 16 arranged above the inductors 12, 14 of the T-coil, or the inductor 16 arranged below the inductors 12, 14 of the T-coil. In an embodiment, the inductor 16 may include only a single coil of windings, instead of multiple coils of windings. In an embodiment, the windings 32, 34 of the inductor 16 may be disposed in different metallization levels and connected in parallel, instead of in series. In an embodiment, the windings 32, 34 of the inductor 14 may be connected in series, instead of in parallel. In an embodiment, the inductor 14 may include multiple coils that may be connected in either parallel or series.

The windings 32, 34, 36, 38, 40 arranged in the different metallization levels of the BEOL interconnect structure 30 and the and vias 42, 46, 48, 50, 52 arranged in the different via levels of the BEOL interconnect structure 30 may be formed by a damascene process in which trenches and via openings are formed with lithography and etching processes in the associated interlayer dielectric layer and those trenches and via openings are filled with one or more conductors (e.g., one or more metals) that are deposited and planarized. The primary conductor of the windings 32, 34, 36, 38, 40 and vias 42, 46, 48, 50, 52 may be composed of a metal, such as copper, cobalt, or ruthenium, that is deposited by, for example, electroless or electrolytic deposition using a seed layer. A conductive barrier/liner layer may arranged between the primary conductor and the surfaces of the interlayer dielectric layer. The barrier/liner layer may be composed of one or more conductive materials, such as titanium nitride, tantalum nitride, tantalum, titanium, tungsten, tungsten nitride, cobalt, ruthenium, or a layered stack of these conductive materials (e.g., a bilayer of titanium and titanium nitride) deposited by, for example, physical vapor deposition or chemical vapor deposition. The interlayer dielectric layers 62-78 may be composed of one or more dielectric materials, such as silicon dioxide or silicon nitride.

In an embodiment, field-effect transistors may be connected with the inductor 12, inductor 14, and/or inductor 16 to provide the ability to tune the respective inductance values. in an embodiment, any or all of the windings 32, 34, 36, 38, 40 may be composed of a magnetic conductive material in order to enhance the inductance of the associated inductors 12, 14, 16, which may permit further reductions in size. In an embodiment, the interlayer dielectric layers 62-78 associated with one or more of the metallization levels of the inductors 12, 14, 16 may include air gaps of lower permittivity than a solid dielectric material, which may reduce capacitive coupling. In an embodiment, the inductors 12, 14 may be arranged as a Pi-coil instead of as a T-coil.

The composite structure including the inductors 12, 14 of the T-coil and the inductor 16 has a reduced size because the inductor 16 is embedded within the inductors 12, 14, which contrasts with a laterally-spread arrangement for a T-coil and peaking inductor that makes inefficient use of the available space on a chip. To further improve the efficient use of the available space on the chip, the inductors 12, 14 of the T-coil and the inductor 16 of the composite structure also share a common keepout zone around their vertically-stacked coils, instead of having a keepout zone for the inductors 12, 14 of the T-coil and a separate keepout zone for the inductor 16 as in laterally-spread arrangements. The magnetic coupling between the inductor 12, 14 of the T-coil and the inductor 16 is accounted for at device level, instead of at the layout level, due to integration into the composite structure. The size of the inductor 16 may be increased to, for example, increase the quality factor without the same concerns about inefficient use the available space on the chip as arise when the T-coil and the peaking inductor have a laterally-spaced arrangement.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. In the latter case, the chip is mounted in a single chip package (e.g., a plastic carrier, with leads that are affixed to a motherboard or other higher level carrier) or in a multichip package (e.g., a ceramic carrier that has either or both surface interconnections or buried interconnections). In any case, the chip may be integrated with other chips, discrete circuit elements, and/or other signal processing devices as part of either an intermediate product or an end product.

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction perpendicular to the horizontal, as just defined. The term "lateral" refers to a direction within the horizontal plane.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate +/−10% of the stated value(s).

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or in "direct contact" with another feature if intervening features are absent. A feature may be "indirectly on" or in "indirect contact" with another feature if at least one intervening feature is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
   a back-end-of-line interconnect structure including a first metallization level, a second metallization level, and a third metallization level arranged between the first metallization level and the second metallization level;
   a T-coil including a first inductor having a first coil arranged in the first metallization level and a second inductor having a second coil arranged in the second metallization level; and
   a peaking inductor having a first coil arranged in the third metallization level,
   wherein the first coil of the first inductor, the second coil of the second inductor, and the first coil of the peaking inductor are stacked in the back-end-of-line interconnect structure with an overlapping arrangement.

2. The structure of claim 1 wherein the back-end-of-line interconnect structure includes a vertical interconnection extending from the first coil of the first inductor to the second coil of the second inductor.

3. The structure of claim 2 wherein the vertical interconnection penetrates through the third metallization level without connection to the first coil of the peaking inductor.

4. The structure of claim 2 wherein the T-coil and the peaking inductor include a central region that is filled by dielectric material of the back-end-of-line interconnect structure, and the vertical interconnection extends through the central region.

5. The structure of claim 2 wherein the vertical interconnection includes a first via in a first via level between the first metallization level and the third metallization level, and the vertical interconnection includes a second via in a second via level between the second metallization level and the third metallization level.

6. The structure of claim 1 wherein the first metallization level is arranged over the third metallization level, the second metallization level is arranged under the third metallization level, the back-end-of-line interconnect structure includes a fourth metallization level arranged under the second metallization level, and the second inductor includes a third coil disposed in the fourth metallization level that is coupled in parallel with the second coil.

7. The structure of claim 1 wherein the first metallization level is arranged over the third metallization level, the second metallization level is arranged under the third metallization level, the back-end-of-line interconnect structure includes a fourth metallization level arranged between the first metallization level and the second metallization level, and the peaking inductor includes a second coil disposed in the third metallization level that is coupled in series with the first coil of the peaking inductor.

8. The structure of claim 1 wherein the first inductor, the second inductor, and the peaking inductor are connected at a common node.

9. The structure of claim 8 further comprising:
a design element coupled by the peaking inductor with the common node;
an input/output pad coupled by the first inductor with the common node; and
a termination resistor coupled by the second inductor with the common node.

10. The structure of claim 9 further comprising:
an electrostatic discharge device coupled with the common node.

11. The structure of claim 1 wherein the first coil of the first inductor has a first perimeter surrounding a first area, the second coil of the second inductor has a second perimeter surrounding a second area, the first coil of the peaking inductor has a third perimeter surrounding a third area, the third area is less than the first area, and the third area is less than the second area.

12. The structure of claim 1 wherein the first coil of the first inductor has a first perimeter surrounding a first area, the second coil of the second inductor has a second perimeter surrounding a second area, the first coil of the peaking inductor has a third perimeter surrounding a third area, and the third perimeter of the first coil of the peaking inductor is circumscribed by the first perimeter of the first coil of the first inductor.

13. The structure of claim 11 wherein the third perimeter of the first coil of the peaking inductor is circumscribed by the second perimeter of the second coil of the second inductor.

14. A method comprising:
forming a first inductor of a T-coil having a first coil arranged in a first metallization level of a back-end-of-line interconnect structure;
forming a second inductor of the T-coil having a second coil arranged in a second metallization level of the back-end-of-line interconnect structure; and
forming a peaking inductor having a coil arranged in a third metallization level of the back-end-of-line interconnect structure,
wherein the third metallization level is arranged between the first metallization level and the second metallization level, and the first coil of the first inductor, the second coil of the second inductor, and the coil of the peaking inductor are stacked in the back-end-of-line interconnect structure with an overlapping arrangement.

15. The method of claim 14 further comprising:
forming a first vertical interconnection in the back-end-of-line interconnect structure that extends from the first coil of the first inductor to the second coil of the second inductor.

16. The method of claim 15 wherein the first vertical interconnection penetrates through the third metallization level without connection to the coil of the peaking inductor.

17. The method of claim 15 wherein the first vertical interconnection includes a first via in a first via level between the first metallization level and the third metallization level, and the first vertical interconnection includes a second via in a second via level between the second metallization level and the third metallization level.

18. The method of claim 15 further comprising:
forming a second vertical interconnection in the back-end-of-line interconnect structure that extends from the second coil of the second inductor to the coil of the peaking inductor.

19. The method of claim 15 wherein the first coil of the first inductor has a first perimeter surrounding a first area, the second coil of the second inductor has a second perimeter surrounding a second area, the coil of the peaking inductor has a third perimeter surrounding a third area, and the third perimeter of the coil of the peaking inductor is circumscribed by the first perimeter of the first coil of the first inductor.

20. The method of claim 19 wherein the third perimeter of the coil of the peaking inductor is circumscribed by the second perimeter of the second coil of the second inductor.

* * * * *